US012055452B2

(12) United States Patent
Brucker

(10) Patent No.: US 12,055,452 B2
(45) Date of Patent: Aug. 6, 2024

(54) LOAD-LOCK GAUGE

(71) Applicant: MKS Instruments, Inc., Andover, MA (US)

(72) Inventor: Gerardo A. Brucker, Longmont, CO (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 18/475,515

(22) Filed: Sep. 27, 2023

(65) Prior Publication Data
US 2024/0019332 A1 Jan. 18, 2024

Related U.S. Application Data

(63) Continuation of application No. 17/154,698, filed on Jan. 21, 2021, now Pat. No. 11,802,806.

(51) Int. Cl.
*G01L 27/00* (2006.01)
*B81B 3/00* (2006.01)
(Continued)

(52) U.S. Cl.
CPC .............. *G01L 21/12* (2013.01); *B81B 3/0018* (2013.01); *G01L 9/0055* (2013.01);
(Continued)

(58) Field of Classification Search
CPC .................................................... G01L 13/025
See application file for complete search history.

(56) References Cited

U.S. PATENT DOCUMENTS 4,131,088 A 12/1978 Reddy
6,672,171 B2 1/2004 Gu et al.
(Continued)

FOREIGN PATENT DOCUMENTS

EP 3690417 A1 5/2020
JP 2015034762 A 2/2015
(Continued)

OTHER PUBLICATIONS

"901P Loadlock Vacuum pressure transducer RS232/RS485/Display," Operation and Installation Manual, (Revision I) September (2014).
(Continued)

*Primary Examiner* — Herbert K Roberts
(74) *Attorney, Agent, or Firm* — Hamilton, Brook, Smith & Reynolds, P.C.

(57) ABSTRACT

A load lock pressure gauge comprises a housing configured to be coupled to a load lock vacuum chamber. The housing supports an absolute vacuum pressure sensor that provides instantaneous high vacuum pressure signal over a range of high vacuum pressures and a differential diaphragm pressure sensor that provides an instantaneous differential pressure signal between load lock pressure and ambient pressure. The housing further supports an absolute ambient pressure sensor. A low vacuum absolute pressure is computed from the instantaneous differential pressure signal and the instantaneous ambient pressure signal. A controller in the housing is able to recalibrate the differential diaphragm pressure sensor based on measured voltages of the sensor and a measured ambient pressure during normal operation of the pressure gauge with routine cycling of pressure in the load lock.

2 Claims, 10 Drawing Sheets

(51) Int. Cl.
*G01L 9/00* (2006.01)
*G01L 9/12* (2006.01)
*G01L 13/02* (2006.01)
*G01L 21/12* (2006.01)

(52) U.S. Cl.
CPC .......... *G01L 13/025* (2013.01); *G01L 27/005* (2013.01); *B81B 2201/0264* (2013.01)

(56) References Cited

U.S. PATENT DOCUMENTS

| | | |
|---|---|---|
| 6,909,975 B2 | 7/2005 | Dozoretz et al. |
| 7,076,920 B2 | 7/2006 | Holcomb et al. |
| 7,477,996 B2 | 1/2009 | Dozoretz et al. |
| 7,962,294 B2 | 6/2011 | Dozoretz et al. |
| 9,335,231 B2 | 5/2016 | Gu et al. |
| 2007/0012116 A1 | 1/2007 | Arnold et al. |
| 2009/0228219 A1 | 9/2009 | Dozoretz et al. |
| 2016/0155653 A1 | 6/2016 | Pomerleau et al. |
| 2017/0062250 A1 | 3/2017 | Kogure et al. |
| 2020/0378853 A1 | 12/2020 | Landmann et al. |
| 2021/0202282 A1 | 7/2021 | Weichart et al. |
| 2022/0228939 A1 | 7/2022 | Brucker |

FOREIGN PATENT DOCUMENTS

| | | |
|---|---|---|
| JP | 2016180650 A | 10/2016 |
| KR | 1020200067202 A | 6/2020 |
| WO | 2022/159572 A1 | 7/2022 |

OTHER PUBLICATIONS

"VPM-7 SmartPirani ATM," Operating Manual, (OPM-VPM-7-01, Revision: A), Mar. 2020.

"Series 390 Micro-Ion® ATM, Four-Sensor Combination Vacuum Gauge Module with RS485 Interface and Analog Output" Manual, Nov. 2016.

Notification of Transmittal of the International Search Report and Written Opinion issued for International Application No. PCT/US2022/013113, entitled "Load-Lock Guage," pp. 1-11, mailed Apr. 26, 2022.

International Search Report and Written Opinion received for PCT Patent Application No. PCT/US2022/013113, mailed on Apr. 26, 2022, 9 pages.

LOAD-LOCK GAUGE

RELATED APPLICATION

This application is a continuation of U.S. application Ser. No. 17/154,698, filed on Jan. 21, 2021. The entire teachings of the above application are incorporated herein by reference.

BACKGROUND

Load locks are a standard feature in industrial and experimental vacuum process chambers. As shown in FIG. 1, samples 102 are loaded through a load lock port 104 into the load lock 106 while it is vented to ambient (atmospheric) pressure. Most load locks are expected to remain particle-free when exposed to ambient. Once the samples are in and secured, the load lock port is closed and pumpdown starts towards high vacuum through a vacuum pump 108. When the pressure in the load lock is low enough, a transfer port 110 is opened to connect the load lock chamber 106 to the process chamber 112, which has its own vacuum pump 112 and pressure gauge 107. The samples are then transferred through the transfer port into the process chamber where they are treated. When the process is completed, the samples are transferred back into the load lock, still at high vacuum, the transfer port is closed, and the load lock is vented so that the processed samples can be removed once the load lock port is opened to ambient or a front opening unified pod (FOUP).

There are several important requirements during proper load lock operation.

The load lock must remain particle-free at all times. This requires making sure that, when the load lock port is opened, there should be a slightly positive pressure relative to ambient pressure. This provides assurance that any air flow goes out of the chamber when the load lock port is opened and prevents dust particles in the room from entering the load lock chamber. In the absence of an inrush of ambient air, dust particle intrusions are avoided. An accurate differential pressure measurement between the load lock chamber and ambient is required to assure that the load lock port is only opened when pressure in the load lock chamber is greater than ambient pressure. Load lock pressure gauges are expected to provide a very accurate differential measurement.

The load lock pressure must also be carefully monitored during pumpdown. The transfer port is only opened at a low enough pressure that eliminates transfer of dust particles from the load lock chamber to the process chamber. In general, pressures below 1 Torr are required in the load lock chamber to eliminate lifting dust particles to the high vacuum process chamber during transition. Accurate absolute pressure measurement at high vacuum in the load lock chamber is required and demanded by load lock operators.

Thus, load lock chambers need to be fitted with high accuracy pressure measurement gauges able to perform two all-important measurements with high accuracy:
  a. Measure differential pressure between the load lock chamber and ambient before opening the load lock port to the ambient conditions.
  b. Measure absolute pressure at high vacuum inside the load lock chamber, particularly before opening the transfer port to the process chamber.

The gauges used for pressure monitoring and control in load lock chambers are often referred to as load lock gauges.

A load lock gauge that met the above requirements was disclosed in U.S. Pat. No. 6,672,171. The gauge included both a high vacuum absolute pressure sensor in the form of a micro-electro-mechanical system (MEMS) Pirani sensor, specifically a MicroPirani™ gauge, and a differential pressure sensor in the form of a differential diaphragm sensor having one face of the diaphragm exposed to pressure in the load lock and an opposite face of the diaphragm exposed to ambient pressure. Although the device met the above requirements, the MEMS Pirani gauge, which provides high accuracy at the high vacuum pressures required to control the transfer port, has accuracy of only about +/−25% at ambient. But some process engineers had an expectation of an accurate absolute pressure measurement in the load lock throughout the pressure range from ambient to high vacuum. U.S. Pat. No. 6,909,975 addressed that additional requirement.

In one embodiment of U.S. Pat. No. 6,909,975, the differential pressure sensor was replaced by two absolute pressure sensors, an absolute piezoresistive diaphragm pressure sensor that was accurate at low vacuum pressures in the load lock and an absolute pressure sensor accurate at ambient pressure outside of the load lock. The differential pressure requirement for opening the load lock port was then met by calculating the differential between the low vacuum pressure sensor and the ambient pressure sensor. The full absolute pressure range was obtained by relying on the Pirani sensor at high vacuum, the absolute piezoresistive diaphragm sensor at low vacuum, and a blend of the two outputs at intermediate vacuum levels. An early implementation of that embodiment was the MKS 390 pressure gauge. The MKS 390 gauge included a MEMS Pirani sensor, an absolute piezoresistive diaphragm sensor and a barometer. It additionally included an ionization pressure gauge, as was also suggested in U.S. Pat. No. 6,909,975, for providing very high vacuum absolute pressure readings at even higher vacuum than could be supported by the Pirani sensor.

A difficulty with using separate absolute gauges to compute the differential pressure of interest is that the differential pressure of interest is not directly sensed and a calculation based on sensed pressures of distinct sensors is subject to error. Process engineers prefer the very reliable direct differential readings from differential diaphragm sensors.

U.S. Pat. No. 6,909,975 presented a method by which the differential diaphragm pressure sensor output could be used to provide an accurate absolute pressure reading at low vacuum pressures. To that end, a correlation factor between absolute and differential pressure measurements was taken where the absolute pressure in the chamber could be measured accurately and reliably, and the correlation factor was stored. Thereafter, the differential pressure measurement was adjusted with the correlation factor to provide a virtual absolute pressure measurement. Although that correlation factor could be taken and stored at atmospheric pressure when the differential pressure measured zero, the preferred method was to measure the output of the differential pressure sensor at high vacuum, which equaled negative ambient pressure, and to store the absolute value as the correlation factor. That correlation factor could then be added to the differential output of the differential pressure sensor to provide an absolute pressure reading through a full range of pressures in the load lock. Thereafter, the output of the Pirani sensor provided the accurate high vacuum absolute pressure reading, the virtual absolute pressure computed from the differential pressure sensor output provided absolute pressure at low vacuum, and a blend of the two provided absolute pressure at intermediate vacuum pressures. That approach has been used in the very successful MKS 901P gauge, which has been the most widely used load lock gauge in the industry for more than a decade.

The MKS 901P gauge relies on a MEMS Pirani sensor for the absolute high vacuum (low pressure) output and a differential piezoresistive diaphragm (DPRD) sensor for the differential output and low vacuum virtual pressure output. Every time the load lock is pumped below about 1 Torr, the absolute value of the differential pressure is measured and stored in memory as a fixed magnitude positive number. This is basically a fresh measurement of ambient pressure performed with the DPRD itself with high accuracy. From then on, all differential readings from the DPRD can be subtracted from that constant value to provide the absolute pressure in the load lock chamber. Since the DPRD is used to generate the stored value of ambient pressure (during pumpdown) and then used to calculate load lock chamber pressure during vent, the readings are more accurate at low vacuum than what is provided by the Pirani sensor.

SUMMARY

The MKS 901P gauge offers the required very high accuracy high vacuum pressure from the Pirani sensor for controlling the transfer port, high accuracy differential pressure for controlling the load lock port, and also high accuracy absolute pressure even at low vacuum using the virtual pressure approach of U.S. Pat. No. 6,909,975. To maintain that high accuracy low vacuum absolute pressure, it is important that the correlation factor correspond to the actual ambient pressure. The correlation factor is thus updated whenever the load lock pressure is reduced to high vacuum. Oscillations in ambient pressure of +/−10 Torr may, however, occur throughout a day. If the correlation factor is not updated often enough, the oscillations in ambient pressure can lead to inaccuracies in the low vacuum absolute pressure readings. Although those readings are not critical to operation of the transfer port or the load lock port, they are less than optimal. To provide even more accuracy even at low vacuum pressures, another absolute pressure sensor such as the absolute piezoresistive diaphragm sensor used in the MKS 390 product could be added to the gauge. However, such a sensor adds significantly to the expense of the overall gauge and itself has the drawback of undesirable hysteresis.

To improve on the accuracy of absolute low vacuum pressure readings derived from the differential diaphragm pressure sensor at reasonable expense, an absolute ambient pressure sensor is added to the gauge. Such gauges include a diaphragm exposed at one face to a reference vacuum and exposed to ambient pressure at an opposite face. They are widely used as barometers, such as in altimeters, and thus provide very accurate ambient pressure readings at low additional cost. With the ambient pressure sensor included in the gauge, it is no longer necessary to store a correlation factor at a specific process state. Rather, the exact instantaneous ambient pressure can be added to the very accurate differential pressure through the full range of load lock pressures. The ambient pressure sensor included in the gauge also allows for synchronization of the Pirani gauge at ambient pressure and automatic recalibration of the differential pressure sensor during a normal operating cycle based on sensed ambient pressure.

A pressure gauge comprises a housing configured to be coupled to a vacuum chamber. An absolute vacuum pressure sensor in the housing is configured to be exposed to the vacuum chamber and is operable at high vacuum to provide an instantaneous high vacuum pressure signal accurate over a range of high vacuum pressures. A differential diaphragm pressure sensor in the housing comprises a diaphragm configured to be exposed to the vacuum chamber at one face and to ambient pressure at an opposite face to provide an instantaneous differential pressure signal. An absolute ambient pressure sensor in the housing is exposed to ambient pressure to provide an instantaneous ambient pressure signal. A controller in the housing receives the high vacuum pressure signal from the absolute vacuum pressure sensor, the differential pressure signal from the differential diaphragm pressure sensor, and the ambient pressure signal from the ambient pressure sensor. The controller computes a computed absolute pressure of the vacuum chamber from the instantaneous differential pressure signal and the instantaneous ambient pressure signal, both sensed through a range of low vacuum pressures. The controller provides, as outputs, a differential pressure output from the differential diaphragm pressure sensor signal, an absolute vacuum pressure output taken from the absolute vacuum pressure sensor signal at high vacuum, and an absolute vacuum pressure output from the computed absolute pressure at low vacuum.

The controller may be further configured to calibrate the differential diaphragm pressure sensor based on ambient pressure bridge voltage of the differential diaphragm pressure sensor when the vacuum chamber is at ambient pressure, full-scale bridge voltage of the differential diaphragm pressure sensor when the vacuum chamber is at full scale high vacuum, and a full-scale ambient pressure measured with the absolute ambient pressure sensor when the vacuum chamber is at full scale high vacuum.

The controller may be configured to calibrate the differential diaphragm pressure sensor by measuring ambient pressure bridge voltage of the differential diaphragm pressure sensor when the vacuum chamber is at ambient pressure, measuring full scale bridge voltage of the differential diaphragm pressure sensor when the vacuum chamber is at full scale high vacuum, and measuring full scale ambient pressure with the absolute barometric pressure sensor when the vacuum chamber is at full scale high vacuum. The controller may determine gain of the differential diaphragm pressure sensor from the ambient pressure bridge voltage, the full scale bridge voltage, and the full scale ambient pressure. Instantaneous differential pressure signals may thereafter be determined from an instantaneous bridge voltage, the ambient pressure bridge voltage and the gain. Gain may be computed from $$a = \frac{V_{b,0} - V_{b,FS}}{P_{amb,FS}}$$

where a is gain, $V_{b,0}$ is ambient pressure bridge voltage, $V_{b,FS}$ is full-scale bridge voltage and $P_{amb,Fs}$ is full-scale ambient pressure. Pressure differential may be computed from $$P_D = \frac{V_b - V_{b,0}}{a}$$

where $P_D$ is instantaneous pressure differential and $V_b$ is instantaneous voltage from the differential diaphragm pressure signal.

The pressure gauge may additionally provide an output of instantaneous ambient pressure from the absolute ambient pressure signal.

The absolute vacuum pressure sensor may have an accuracy of 7% or better at high vacuum pressure of 5 Torr. The computed absolute pressure from the instantaneous differential pressure reading may have an accuracy of 1% or better at 60 Torr.

The controller may be configured to compute, at intermediate vacuum pressures, a blended pressure from the instantaneous high vacuum pressure signal and the computed absolute pressure. The controller may output as a chamber pressure signal the instantaneous high vacuum pressure signal over a range of high vacuum pressures, the computed absolute pressure over a range of low vacuum pressures, and the blended pressure at the intermediate vacuum pressures.

The controller may be configured to zero the absolute vacuum pressure signal at ambient pressure.

The absolute vacuum pressure sensor may be a thermal conductivity sensor, such as a MEMS Pirani sensor. The differential diaphragm pressure sensor may be a differential piezoresistive diaphragm pressure sensor. Other differential diaphragm gauges may also be used but the piezoresistive gauge has the benefit of being small and inexpensive. The absolute ambient pressure sensor may comprise a diaphragm exposed at one face to a reference vacuum and exposed at an opposite face to ambient pressure.

In a method of controlling a load lock port and a transfer port of a load lock, an instantaneous high vacuum pressure signal may be provided from an absolute vacuum pressure sensor. Instantaneous differential pressure signal may be provided from a differential diaphragm pressure sensor having a diaphragm exposed to the load lock at one face and exposed to ambient pressure at an opposite face. An instantaneous ambient pressure signal from an absolute ambient pressure sensor may be provided. In an electronic controller, a computed absolute ambient pressure may be computed from the instantaneous differential pressure signal and the instantaneous ambient pressure signal. A transfer port is open to a high vacuum chamber only after the load lock reaches a sufficiently low pressure as indicated by the instantaneous high vacuum pressure signal from the absolute vacuum pressure sensor. A load lock port is opened to ambient only after the instantaneous differential pressure signal from the differential diaphragm pressure sensor indicates load lock pressure at least as high as ambient pressure. An absolute vacuum pressure output from the controller is the absolute vacuum pressure output taken from the absolute vacuum pressure sensor at high vacuum and from the computed absolute pressure at low vacuum.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

A multi-sensor gauge provides the ability to accurately measure both absolute and differential pressures of the load lock chamber through a full range of pressures without the limitations of current devices. A MEMS Pirani sensor provides high vacuum absolute pressure for transfer port control. A differential piezoresistive diaphragm (DPRD) pressure sensor provides the single sensor differential pressure measurement that the industry has come to expect from the MKS 901P and its load lock switches.

The addition of a barometer allows refresh of the ambient pressure measurement in real time to provide up-to-date absolute pressures inside the load lock chamber from the differential pressure sensor, an improvement over the fixed ambient pressure correlation factors stored by the 901P and only refreshed during a load lock pumpdown. There is no need to have repetitive pumpdowns throughout the day to know the ambient pressure and to calculate accurate load lock chamber absolute pressure from the DPRD measurements.

There are also opportunities to synchronize sensors.

The differential sensor can be synchronized with the ambient sensor each time high vacuum is less than about 0.5 Torr inside the load lock chamber. When absolute pressure is less than 0.5 Torr, which is about the typical accuracy of a barometer, we can make sure the ambient sensor and the DPRD read the same, within 0.5 Torr or so. If not, the differential pressure sensor can be automatically recalibrated as discussed below. The ambient sensor continues to track ambient pressure with high precision moving forward and to ensure a correct calculation of load lock chamber absolute pressure. The ambient sensor is finely calibrated before use and can be relied upon throughout operation for a trusted measurement of ambient pressure.

The MEMS Pirani atmospheric reading can be synchronized each time the load lock chamber is vented to ambient. At this point the differential sensor reads zero differential pressure, and the Pirani is synchronized to the barometer. This improves the accuracy of the Pirani sensor at near ambient pressures.

Figure 1:
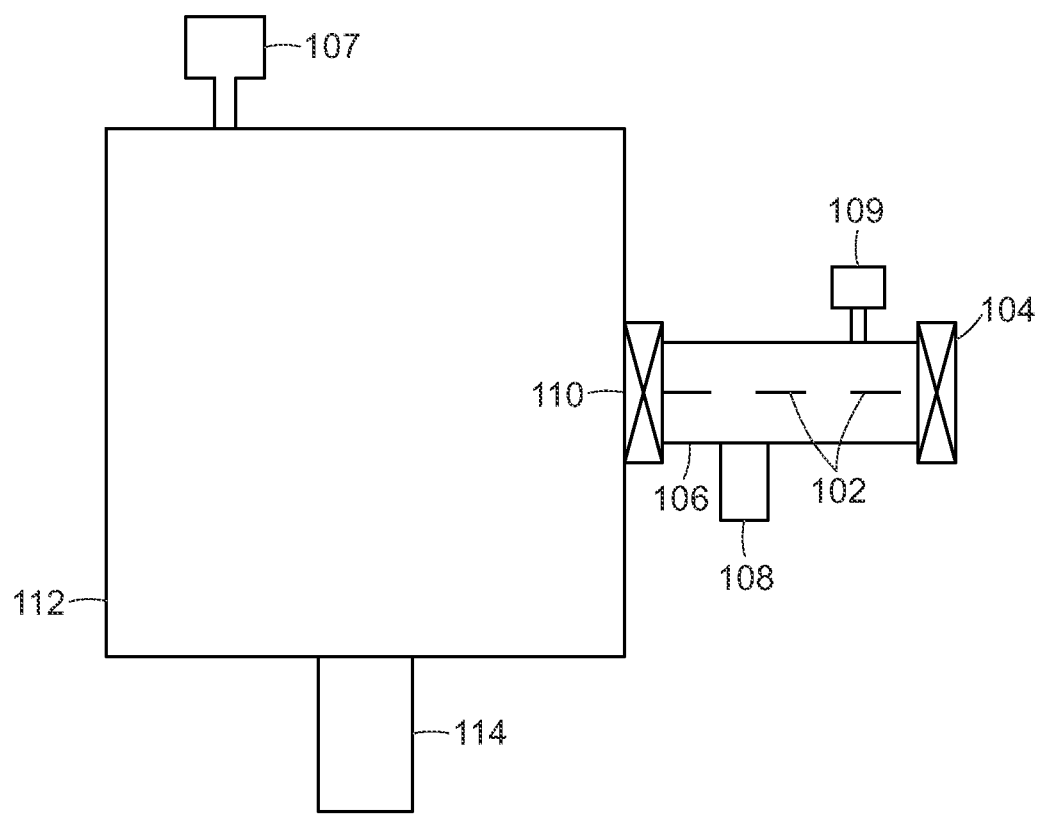
FIG. 1 is a schematic illustration of a load lock with a load lock gauge, the load lock coupled to a process chamber.
Figure 2:
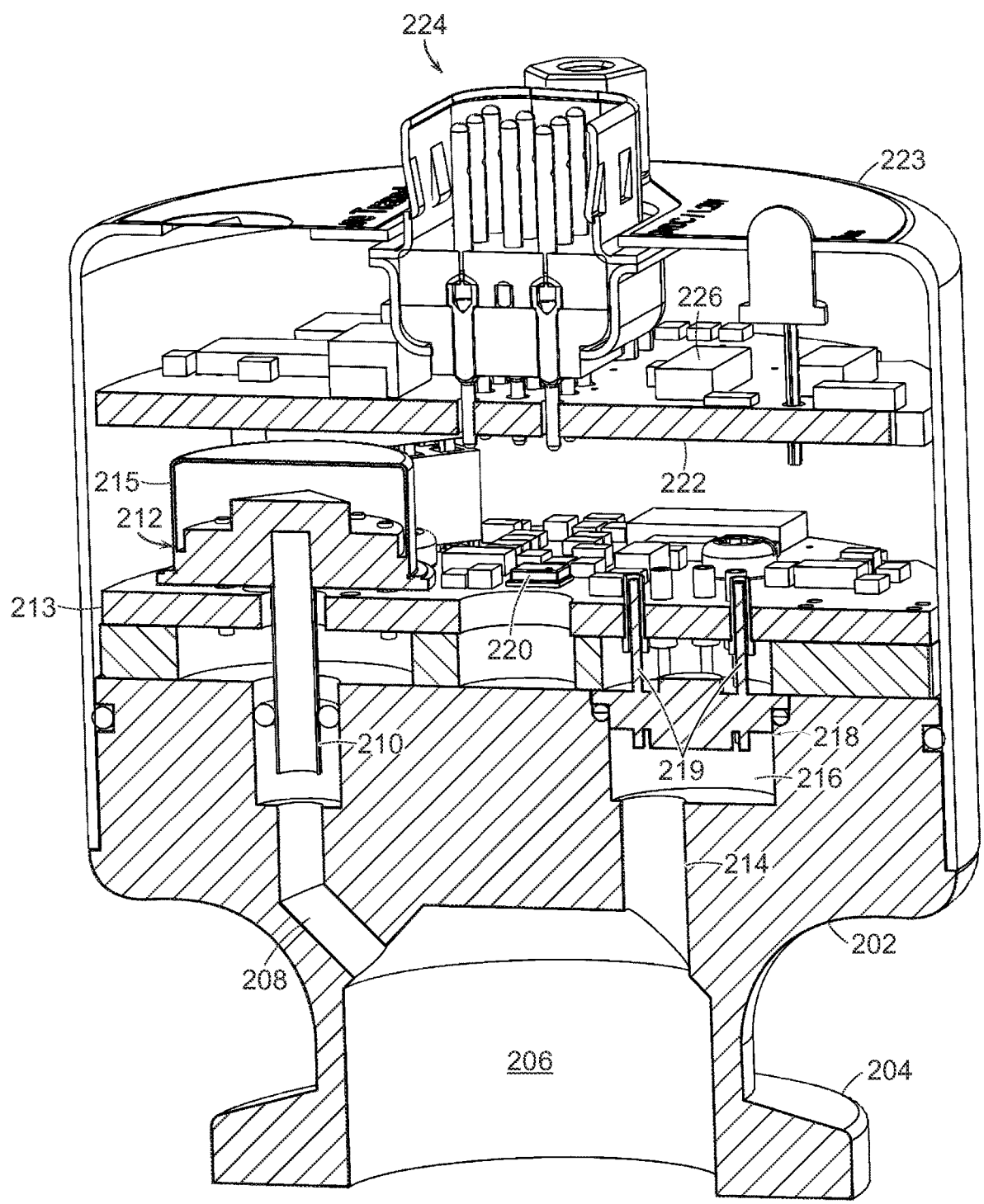
FIG. 2 is a cross-sectional view of a load lock pressure gauge embodying the invention.

FIG. 2 illustrates a pressure gauge, having particular application as a load lock gauge, that is based on but improves upon the MKS 901P gauge. A block 202 has a flange 204 to mount the gauge to the side of a load lock chamber. A volume 206 within the block is exposed to the load lock chamber. A conduit 208 through the block from the volume 206 exposes a tube 210 to the load lock pressure. The tube 210 extends to a differential pressure sensor 212 which may be a differential piezoresistive diaphragm sensor (DPRD). (The gauge is illustrated only as a solid block in FIG. 2; further detail is presented in FIGS. 3A-C.) The differential sensor 212 is mounted to a sensor board 213. It includes a protective can 215 that allows exposure of the differential sensor to ambient pressure from outside of the gauge.

A second conduit 214 in the block 202 extends to a volume 216 to which a MEMS Pirani absolute pressure sensor 218 is exposed. (The sensor 218 is only illustrated as a solid block in this figure and will be described further with respect to FIG. 5.) The Pirani gauge 218 is suspended below the sensor board 213 by electrical pins 219.

An additional sensor not available in the 901 P gauge is an ambient pressure sensor 220 that may be a conventional barometer. The sensor 220 is exposed only to ambient pressure. Barometers are widely available with high accuracy of less than plus or minus 2 Torr. With recalibration, that accuracy can be improved to plus or minus 0.5 Torr, preferably plus or minus 0.25 Torr or better. Barometers typically include temperature compensation.

Additional electronic components, including a controller microprocessor 226, are mounted to the board 213 and to a microprocessor board 222. The sensors and electronic components are enclosed within a protective housing 223. Communications to and from the pressure gauge are through electrical connections 224. As discussed in detail below, the microprocessor 226 is responsible for pressure measurements and outputs. Notably, the microprocessor is responsible for pressure synchronization of the Pirani sensor and synchronization and calibration of the differential diaphragm sensor.

Figure 3A:
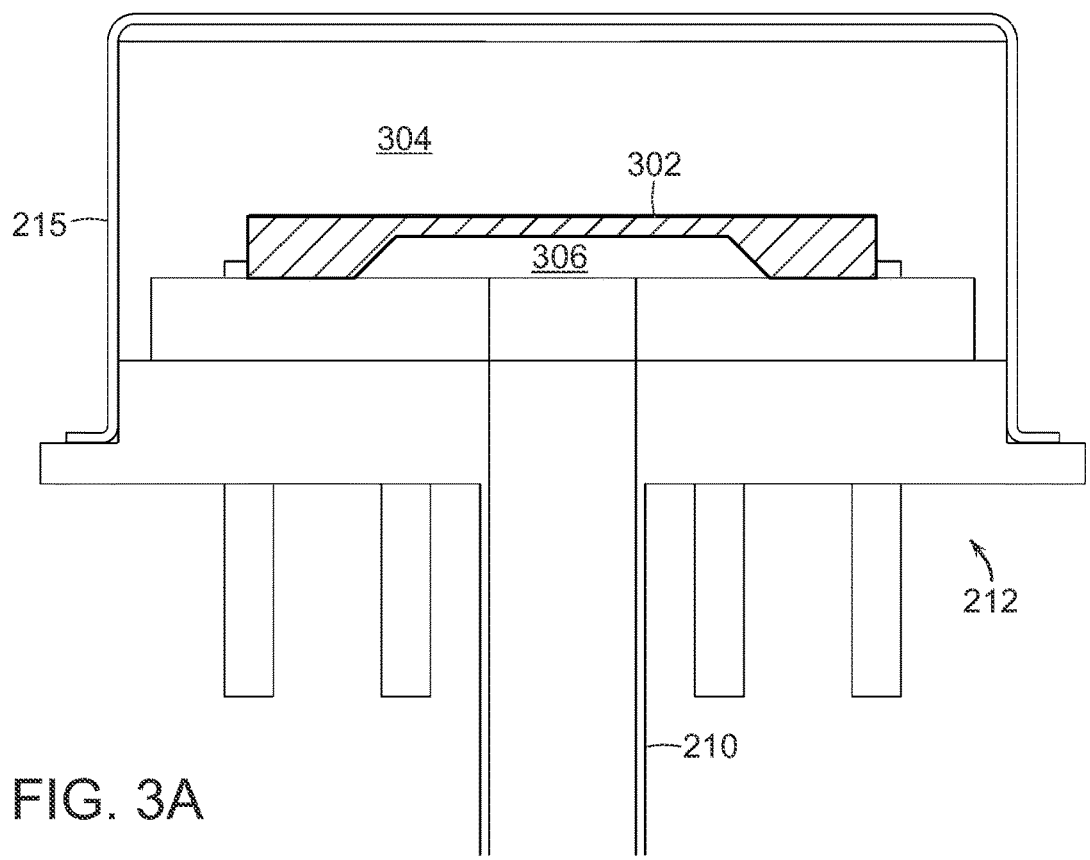
FIGS. 3A-C are cross-sectional schematics of the differential diaphragm pressure sensor of FIG. 2 at three different pressure states of the load lock.
Figure 3B:
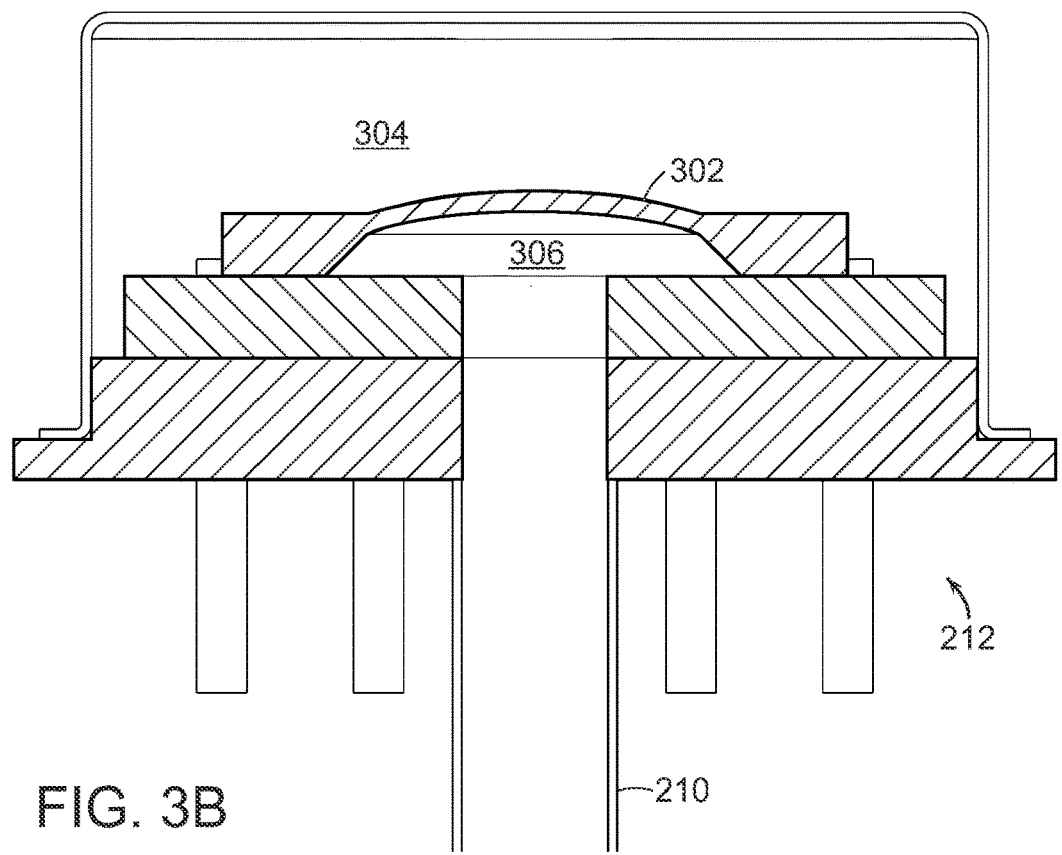
Figure 3C:
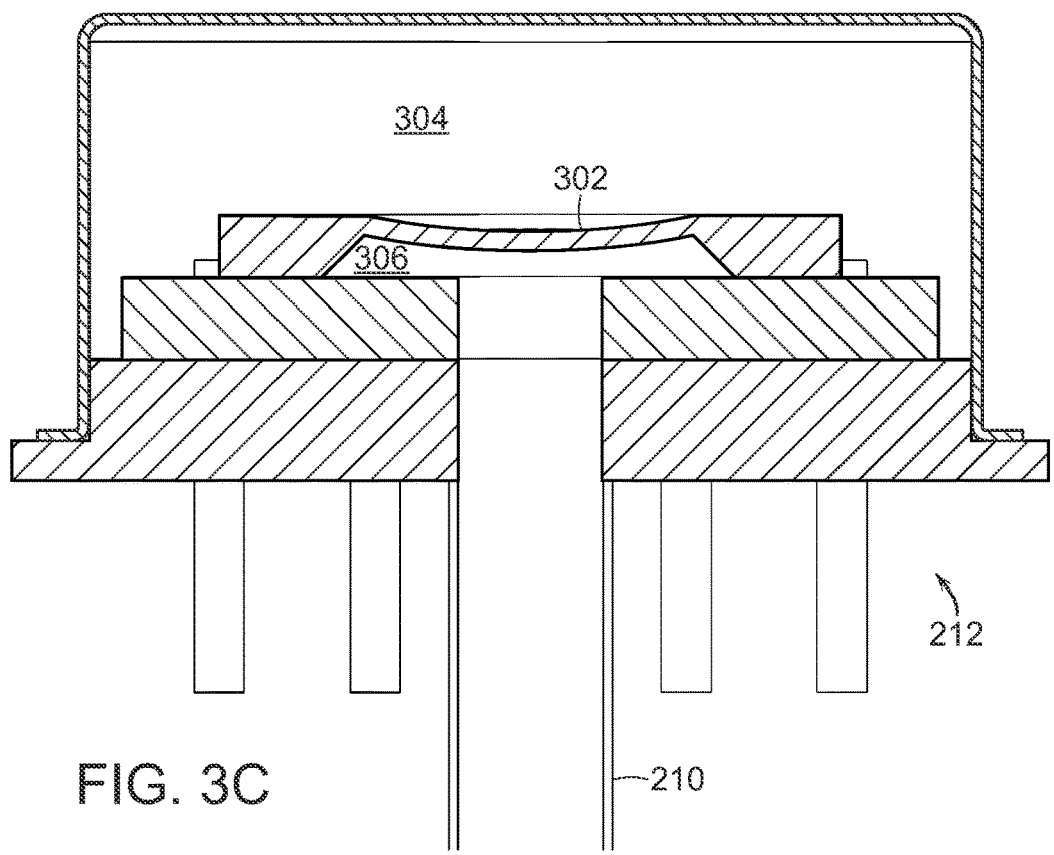

FIGS. 3A-C are schematic illustrations of the differential pressure sensor 212 in three different states. The sensor includes a diaphragm 302 that is exposed to ambient pressure in an upper volume 304. Its opposite face is exposed to load lock pressure in a chamber 306 that is in fluid communication with the tube 210. The diaphragm 302 may, for example, be of silicon and have piezoresistive strain elements mounted thereon. When the pressure in the volumes 304 and 306 are the same, the diaphragm has zero deflection as shown in FIG. 3A, and the calibrated device provides a zero differential pressure output. If a positive pressure is applied to the load lock, the diaphragm is pushed upwardly as shown in FIG. 3B to provide a voltage output that is converted to a positive differential pressure output. As a vacuum is drawn in the load lock, the diaphragm is drawn downward as in FIG. 3C, and the sensor outputs a negative voltage output that is converted to a negative differential pressure reading. This is a direct, gas-species-independent differential pressure reading.

Figure 4:
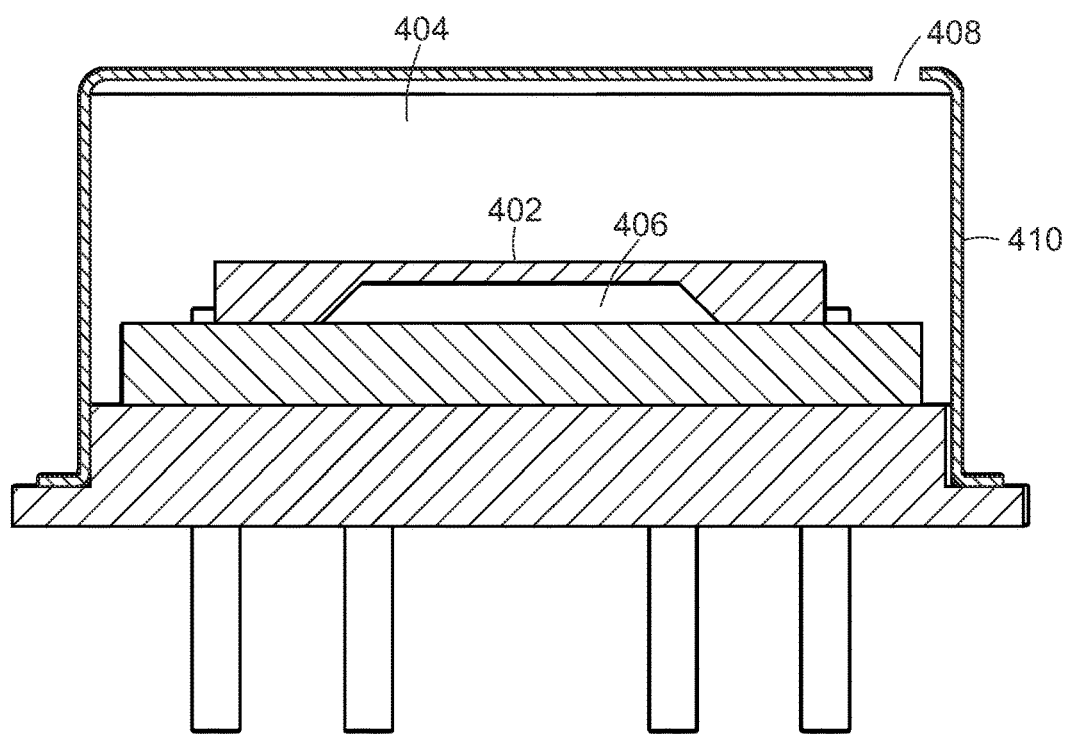
FIG. 4 is a schematic cross-sectional view of the ambient pressure sensor of FIG. 2.

FIG. 4 is a schematic illustration of the barometer used in the ambient pressure sensor. It also includes a diaphragm such as a silicon diaphragm 402 that is exposed at its top surface to a volume 404 exposed to ambient pressure through a hole 408 in housing 410. The bottom surface of the diaphragm 402 is exposed to a closed chamber at a reference pressure. The sensor may be a piezoresistive diaphragm sensor that provides a voltage output with flexure of the diaphragm driven by ambient pressure relative to the reference pressure in chamber 406. When properly calibrated, the voltage output is converted to a very accurate reading of ambient pressure.

The high vacuum absolute pressure sensor 218 is a thermal conductivity sensor, specifically a MEMS Pirani sensor. Other sensors, such as a wire-based Pirani sensor, may also be used. Thermal conductivity sensors measure pressure based on the relationship between temperature of a heated sensor resistor and the amount of heating power applied to the sensor resistor. For example, the amount of heating power required to maintain a thin wire (a sensor resistor) at a constant temperature, $T_S$, may be monitored. As the pressure of gas increases, the gas has increased thermal conductivity and takes additional heat away from the heated wire, and the heating power required to keep the wire at constant temperature increases. A gas species dependent calibration curve correlating heating power to pressure allows pressure measurements. Calibrations are typically performed at the factory against pure Nitrogen gas. This is an indirect pressure measurement where heating power is proportional to the gas pressure.

This principle is used in the well-known Pirani gauge, in which heat loss is measured with a Wheatstone bridge network that serves both to heat the sensing element and to measure its resistance. In a Pirani gauge, a temperature-sensitive resistance is connected as one arm of a Wheatstone bridge. The temperature-sensitive resistance is mounted in a chamber exposed to the vacuum environment whose pressure is to be measured.

A conventional Pirani gauge is calibrated against several known pressures to determine a relationship between pressure of a gas and the power loss to the gas or the bridge voltage. Then, assuming end losses and radiation losses remain constant, the unknown pressure of a gas may be directly determined by the power lost to the gas or related to the bridge voltage at bridge balance.

Figure 5:
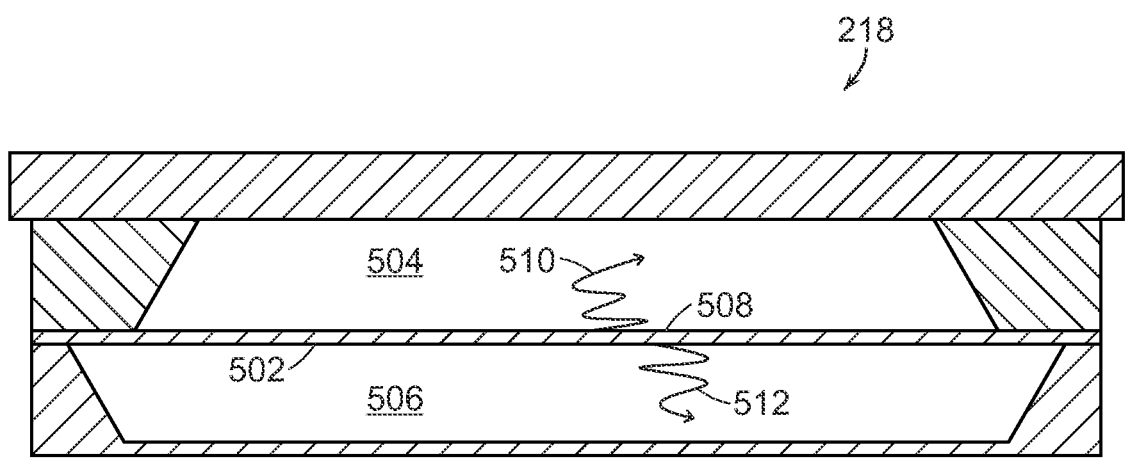
FIG. 5 is a schematic cross-sectional view of the MEMS Pirani gauge of FIG. 2.

The specific thermal conductivity sensor used here is a MEMS Pirani sensor as illustrated in FIG. 5. This sensor includes a silicon nitride membrane 502 that extends across a chamber having a volume 504 and a volume 506. The volumes 504 and 506 are in communication with the volume 216 in the pressure gauge and are thus at the load lock pressure. A heated resistive element is formed on the membrane 502 at 508. Due to the geometry of the sensor, convection cannot take place within the cavity and, consequently, the sensor is insensitive to mounting position. Gas molecules are passed by diffusion only to the heated element where a heat loss to the gas is measured. As with a conventional Pirani gauge, heat is conducted from the heated resistor into the surrounding gas at 510 and 512 from the resistive element on the membrane 502. As in a conventional Pirani sensor, as the pressure of gas increases, the gas has increased thermal conductivity and takes additional heat away from the heated resistor, and the heating power required to keep the wire at constant temperature increases. A calibration curve correlates heating power to pressure. The MEMS Pirani sensor provides very accurate pressure readings at high vacuum and is thus particularly suited to controlling the transfer port to the high vacuum process chamber. However, as discussed above, it is much less accurate at higher pressures approaching ambient pressure.

To obtain accurate absolute pressure readings at low vacuum without requiring an expensive and perhaps less accurate absolute pressure sensor, this system determines the absolute pressure in the load lock pressure from the differential pressure sensed with the DPRD sensor. Since the differential pressure is relative to ambient pressure, the absolute vacuum pressure can be determined by adding ambient pressure. This calculation is similar to the approach of U.S. Pat. No. 6,909,975 except that the actual instantaneous ambient pressure is used in the computation rather than a stored correlation factor. If both faces of the differential pressure sensor are exposed to ambient, the differential pressure reading is zero. Computing absolute pressure from the differential pressure at ambient therefore requires that the ambient pressure sensed by the barometer be added to the differential pressure. Similarly, with the load lock evacuated to lower pressures, those absolute pressures can be computed from $$P_{LL} = P_D + P_{amb} \quad (1)$$

where $P_{LL}$ is the load lock absolute pressure, $P_D$ is the differential pressure and $P_{amb}$ is the instantaneous ambient pressure sensed by the barometer, that is the ambient pressure at the moment of computation.

The load lock pressure gauge provides an absolute pressure output $P_{LL}$ for the load lock pressure that is derived at high vacuum (very low pressure) from the Pirani gauge and at low vacuum (pressure is closer to ambient pressure) from the differential pressure of the DPRD sensor plus the ambient pressure from the barometer. As the single output for the load lock pressure $P_{LL}$ transitions from the Pirani measurement to the differential plus ambient measurement, a difference between the two measurements can be expected if the gas in the load lock is other than the pure nitrogen gas with which the sensors were calibrated. To avoid a step in the output with that transition, a technique, well known in the industry and used in the MKS 901P product, is to blend the two measurements over a range of pressures. In one example of blending, two factory set thresholds define when the measurement is taken solely from the Pirani sensor, taken solely from the differential and barometer sensors, or is a blend of the two. Below a threshold $P_{X,L}$ only the Pirani measurement is used. Above a threshold $P_{X,H}$ only the measurement computed from $P_D$ and $P_{amb}$ is used. Between those thresholds, some form of blending allows for continuous transition from pure Pirani to pure $P_D$ plus $P_{amb}$ measurements. The blending may be linear or nonlinear, but near to the lower threshold, the blended value is weighted more to the Pirani measurement, and toward the upper threshold, the measurement is weighted more toward the computed measurement. A typical low threshold would be 20 Torr and might be user configurable, and an upper threshold might be 60 Torr and be user configurable.

The high and low thresholds may be the same or a simple value $P_X$ may be set such as at about 40 Torr. In either case, there would be no blending, but an abrupt transition between readings as the pressure rises or falls and a likely step in the pressure output $P_{LL}$ at the transition.

Figure 6:
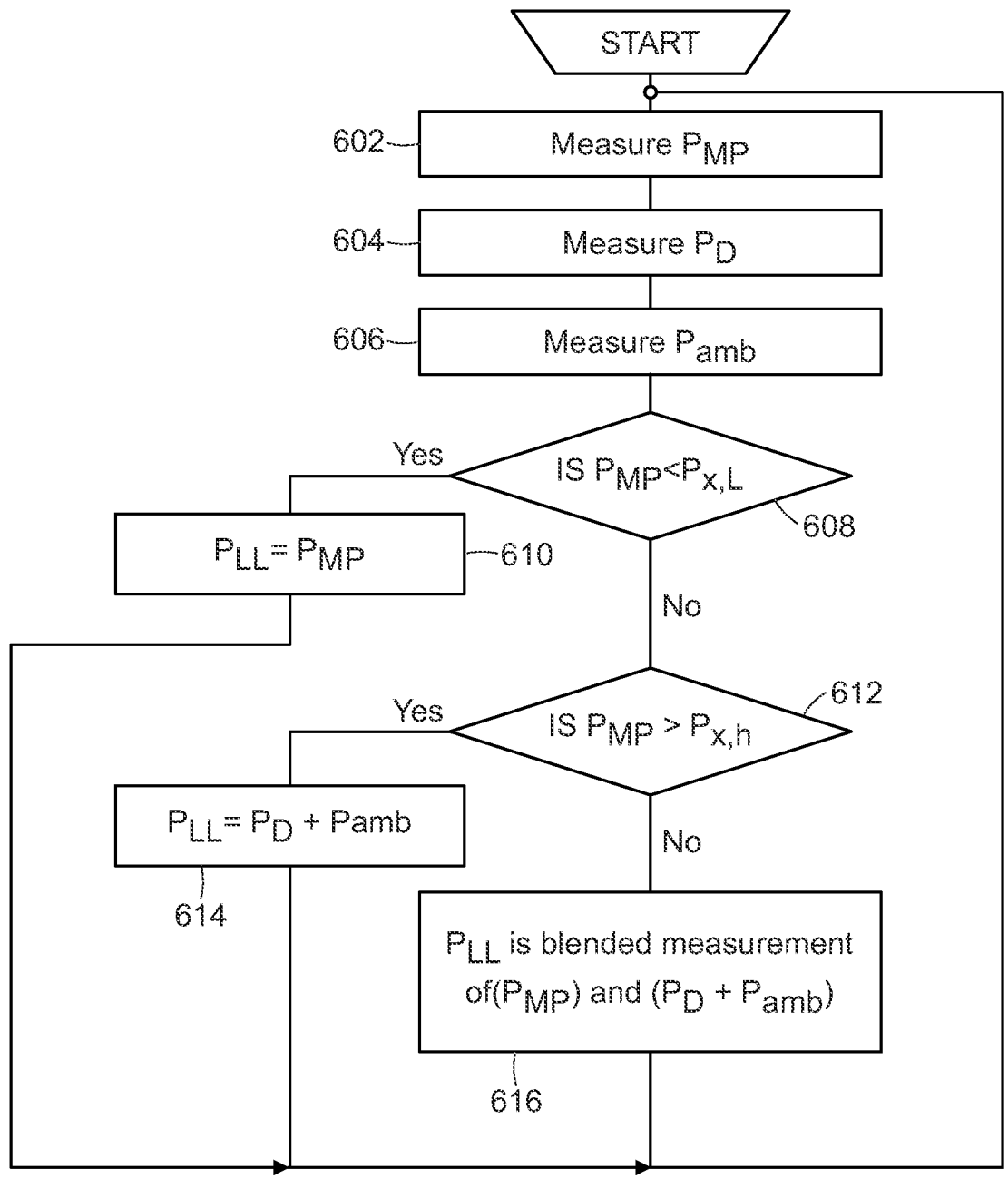
FIG. 6 is a flowchart of a pressure measurement loop of the gauge of FIG. 2.

FIG. 6 is a flowchart of a pressure measurement in the pressure gauge via a measurement loop. In any order, load lock pressure is measured by the Pirani sensor at 602, differential between load lock pressure and ambient pressure is measured by the DPRD sensor at 604, and ambient pressure is measured by the barometer at 606. Each of those measurements is available to the load lock operator throughout the measurement loop. At 608, it is determined whether the Pirani pressure reading $P_{MP}$ is less than the low blending threshold $P_{XL}$. If it is, load lock pressure $P_{LL}$ is set to equal $P_{MP}$ at 610. If the Pirani pressure at 608 is not below the lower threshold, the Pirani pressure is compared to the high blending threshold $P_{SH}$ at 612. If the Pirani pressure is above that threshold, then load lock pressure $P_{LL}$ is taken to be equal to the sum of $P_D$ and $P_{amb}$ at 614. If the Pirani pressure is not below the lower threshold or above the higher threshold, the pressure is in the blending pressure range, and load lock pressure $P_{LL}$ is determined from a blend of the Pirani pressure $P_{MP}$ and the computed pressure $P_D$ plus $P_{amb}$ at 616. The pressure that is defined in step 610, 614 or 616 is made available to the user. The system then loops back to take another set of measurements. Throughout operation, pressure $P_{MP}$ provided by the Pirani sensor, differential pressure $P_D$ provided by the DPRD, ambient pressure $P_{amb}$ provided by the barometer, and the determined load lock pressure $P_{LL}$ are available to the user for both control and monitoring purposes.

The DPRD sensor is factory calibrated and has accuracy of plus or minus 1% Torr or better. The sensor output is very stable and linear (typically better than 0.1% linearity across the pressure range, and better than plus and minus 1% repeatability), and the sensor holds calibration well. However, over time there can be shifts in voltage offset and in the gain required to maintain accuracy. Having the real-time ambient pressure measurement throughout operation allows for routine calibration of the DPRD during normal operation.

Figure 7:
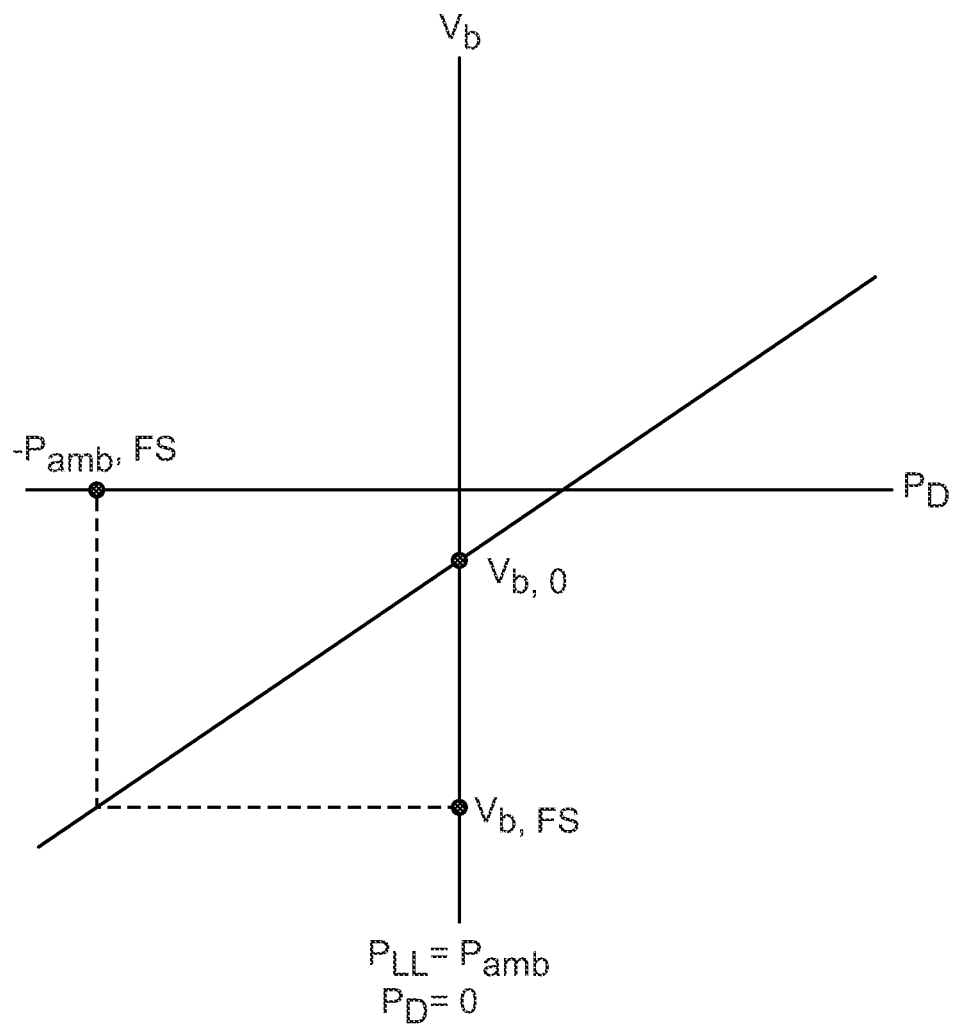
FIG. 7 is a graph of the bridge voltage output from the differential pressure sensor of FIGS. 3A-C plotted against differential pressure.

The output signal from a DPRD is a bridge voltage, $V_b$, that is substantially linearly related to differential pressure on the diaphragm. The relationship between bridge voltage and the differential pressure is shown in FIG. 7. When the load lock chamber is exposed to ambient such that $P_{LL}$ equals $P_{amb}$, and $P_D$ thus equals 0, bridge voltage is at some offset $V_{b,0}$. As the load lock is evacuated to vacuum pressures, bridge voltage becomes more negative. As $P_{LL}$ is approximately 0, typically less than 1.2 Torr, perhaps about 0.5 Torr, there is maximum negative deflection of the DPRD diaphragm toward load lock pressure, and full scale bridge voltage $V_{b,FS}$ is reached at $P_D$ equal to $-P_{amb,FS}$. As noted, the relationship between the $V_b$ and $P_D$ is substantially linear such that the following relationship applies:

$$V_b = V_{b,0} + \left( \frac{V_{b,0} - V_{b,FS}}{P_{amb,FS}} \right) P_D \quad (2)$$

where $V_{b,0}$ is the voltage offset at zero differential pressure. It can be seen from this equation that the slope a of FIG. 7, that is the gain applied to $P_D$, is:

$$a = \left( \frac{V_{b,0} - V_{b,FS}}{P_{amb,FS}} \right) \quad (3)$$

Simplifying equation 2 with b=offset=$V_{b,0}$, the pressure differential $P_D$ is:

$$P_D = \frac{V_b - b}{a} \quad (4)$$

The MKS 901P gauge is factory calibrated. That calibration usually serves for the life of the gauge, but the gauge can also be recalibrated in the field using special codes through the communication connections 22, using a precision external ambient pressure reference gauge, and by exercising the load lock gauge through ambient and high-pressure states to determine offset b and slope a for subsequent measurements of differential pressure $P_D$. The gauge disclosed here can self-calibrate during normal operation.

Whenever the load lock is exposed to ambient, as may be indicated from a system controller through the communication inputs 224, offset $V_{b,0}$ can be confirmed and the stored value updated as required. Subsequently, at load lock pressure of about zero, full-scale, both $V_{b,FS}$ and $P_{amb,Fs}$ can be measured to allow for computation of the slope (gain) a. In that way, the DPRD calibration parameters of offset and slope can be redetermined in each cycle of operation if required. The calibration procedure performed in the pressure gauge microprocessor 226 during operation may be substantially the same as that performed in the factory. A significant advantage of including the ambient pressure sensor 220 in the pressure gauge is that the procedure can be automatically performed in the field whenever it is determined necessary, such as when absolute pressure indicated by the differential pressure computation at high vacuum does not match the negative of measured ambient pressure.

Figure 8A:
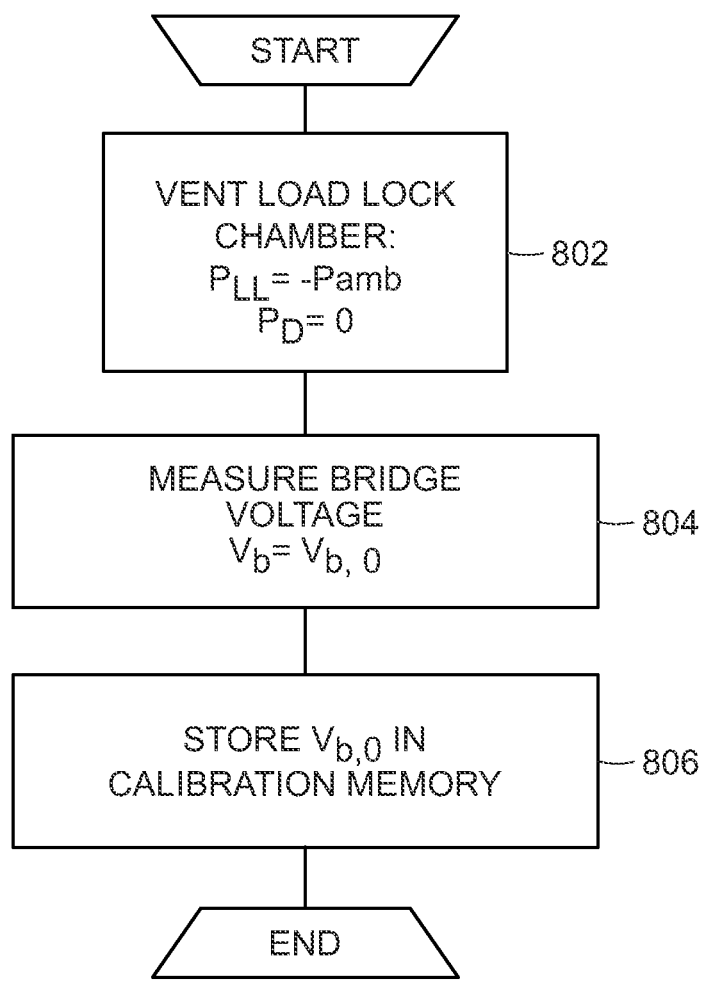
FIG. 8A is a flowchart of the pressure gauge controller microprocessor for the differential pressure sensor offset determination.

FIG. 8A illustrates the offset determination under microprocessor control. When the load lock is vented to ambient at 802 as, for example, signaled from a system controller, it is known that load lock pressure $P_{LL}$ equals ambient pressure $V_{amb}$ and the differential $P_D$ is zero. At 804, with the load lock vented, the bridge voltage $V_b$ at $P_D=0$, $V_{b,0}$, is measured by reading the voltage $V_b$ through a high-resolution analog-to-digital converter. That measured voltage is stored in calibration memory at 806 as the voltage offset b.

Figure 8B:
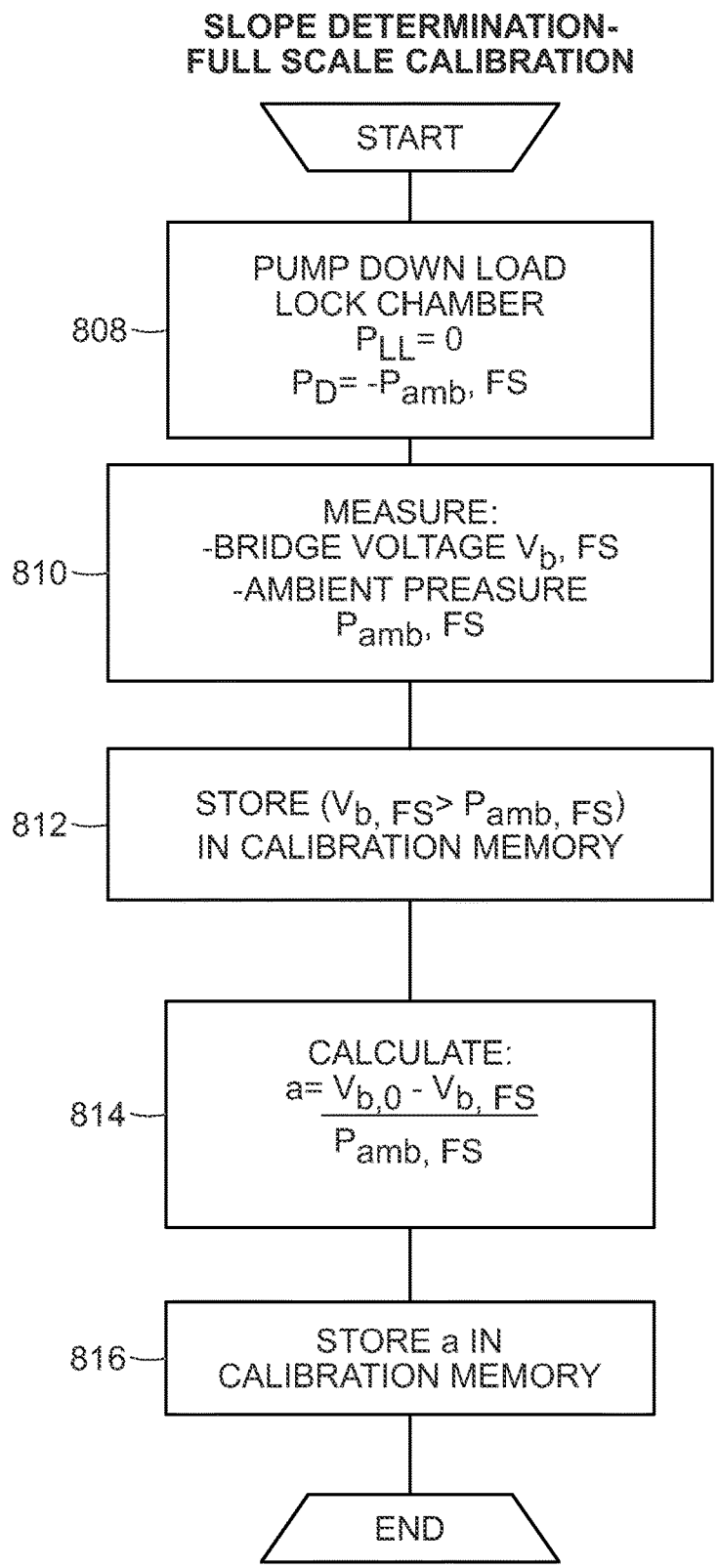
FIG. 8B is a flowchart of the controller microprocessor for slope determination and full-scale calibration of the differential pressure sensor.

Slope is determined for full scale calibration in the microprocessor procedure of FIG. 8B. The load lock is pumped down in normal operation to load lock pressure of about zero, within about the accuracy of the barometer, as measured by the Pirani sensor. At that pressure, the pressure differential is equal to $-P_{amb,FS}$ at 808. At 810, the full scale bridge voltage $V_{b,FS}$ is measured, and a precise full scale ambient pressure $P_{amb,FS}$ is measured using the barometer. At 812, both $V_{b,FS}$ and $P_{amb,FS}$ are stored in calibration memory. At 814, the slope of FIG. 7, which is the gain applied to determine differential pressure, is computed. That slope a is stored in calibration memory at 816.

Thereafter, the stored values $V_{b,0}$ and a are combined with the instantaneous voltage $V_b$ at any pressure to compute the pressure differential $P_D$ using equation (4). Load lock pressure $P_{LL}$ can be computed with equation (1) using the real-time measurements of $P_D$ and $P_{amb}$.

As in the 901P, temperature compensation of the DPRD measurements may also be provided.

Figure 9:
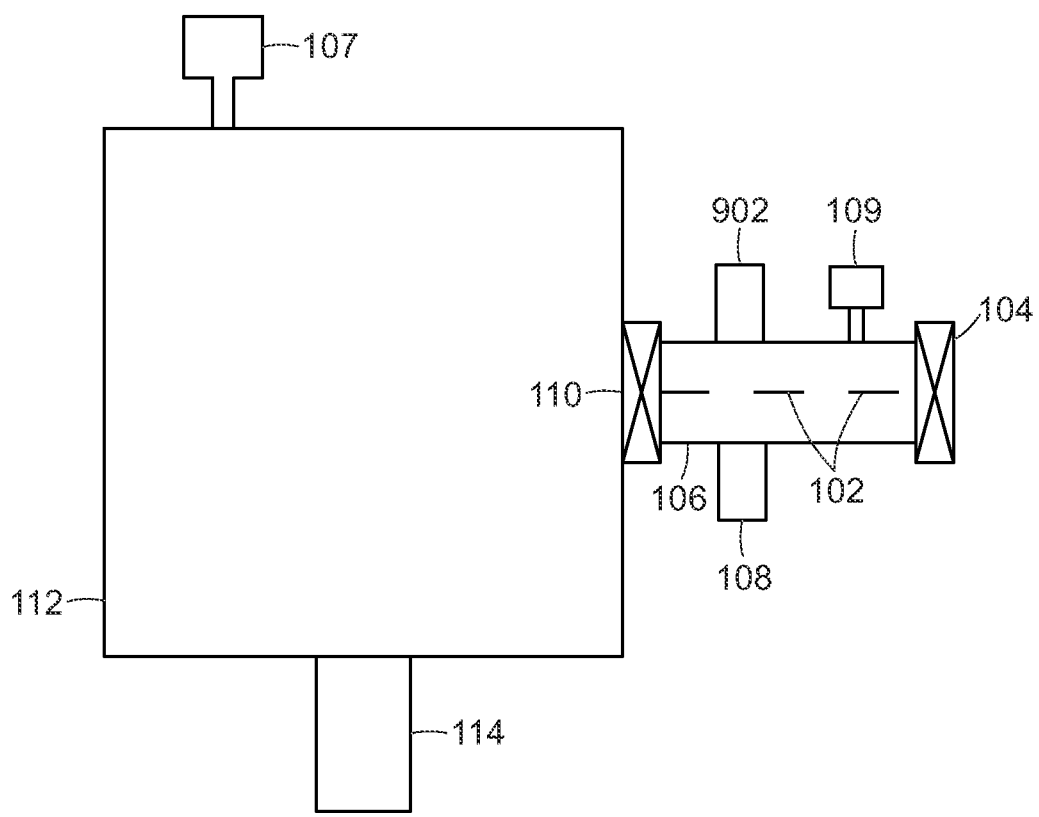
FIG. 9 is a schematic of a system similar to FIG. 1 but with an additional very high vacuum pressure sensor coupled to the load lock.

In addition to the multisensor implementation described here, the scope of this disclosure can be extended into the very high vacuum and ultra-high vacuum levels adding a fourth sensor, such as an ionization sensor, to the array as illustrated at 902 in FIG. 9. With an ionization gauge (cold or hot implementation) added, users can now handle load lock chambers that need to pump down to pressures much lower than a Pirani sensor can monitor before the transfer valve is activated. Such a multisensor is very versatile in allowing accurate venting of the load lock chamber to ambient and in checking high vacuum levels before transferring samples into the process chamber at high vacuum (very low pressure).

This disclosure has so far focused on the addition of a standard barometric sensor to provide real-time, uninterrupted ambient pressure measurements. Barometers are very specific in that they allow measurement of ambient pressure between sea level and the highest mountain, with very high resolution. They are commonly used as altimeters. However, the scope of this disclosure expands beyond those standard sensors, including any sensing technology capable of accurately measuring ambient pressure. This includes high end diaphragm deflection sensors such as piezoresistive, capacitive and optical deflection diaphragm sensors.

The present system is not limited to the use of differential piezoresistive diaphragm sensors. Instruments could also be built using differential diaphragm sensors relying, for example, on both optical and capacitive measurements of differential diaphragm deflection. Capacitive and optical diaphragm deflection pressure sensors can, for example, be made of a metal, ceramic or sapphire membrane.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A pressure gauge comprising:
   a housing configured to be coupled to a vacuum chamber;
   an absolute vacuum pressure sensor in the housing configured to be exposed to the vacuum chamber and operable at high vacuum to provide an instantaneous high vacuum pressure signal;
   a differential diaphragm pressure sensor in the housing comprising a diaphragm configured to be exposed to the vacuum chamber at one face and to ambient pressure at an opposite face to provide an instantaneous differential pressure signal;
   an absolute ambient pressure sensor in the housing exposed to ambient pressure to provide an instantaneous ambient pressure signal; and
   a controller in the housing configured to receive the instantaneous high vacuum pressure signal from the absolute vacuum pressure sensor, the instantaneous differential pressure signal from the differential diaphragm pressure sensor, and the instantaneous ambient pressure signal from the ambient pressure sensor, the controller configured to compute a computed absolute pressure of the vacuum chamber from the instantaneous differential pressure signal and the instantaneous ambient pressure signal, both sensed through a range of vacuum pressures, and the controller configured to provide as outputs to a user a differential pressure output from the instantaneous differential pressure signal, an absolute vacuum pressure output taken from the instantaneous high vacuum pressure signal at high vacuum, and an absolute vacuum pressure output from the computed absolute pressure at low vacuum; and
   the controller is further configured to recalibrate the computed absolute pressure automatically when the computed absolute pressure at high vacuum does not match the negative of measured ambient pressure.

2. A method of controlling a load lock port and a transfer port of a load lock comprising:
   providing an instantaneous high vacuum pressure signal from an absolute vacuum pressure sensor;
   providing an instantaneous differential pressure signal from a differential diaphragm pressure sensor having a diaphragm exposed to the load lock at one face and exposed to ambient pressure at an opposite face;
   providing an instantaneous ambient pressure signal from an absolute ambient pressure sensor;
   in an electronic controller, computing a computed absolute pressure from the instantaneous differential pressure signal and the instantaneous ambient pressure signal;
   opening the transfer port to a high vacuum chamber only after the load lock reaches a sufficiently low pressure as indicated by the instantaneous high vacuum pressure signal from the absolute vacuum pressure sensor;
   opening the load lock port to ambient only after the instantaneous differential pressure signal from the differential diaphragm pressure sensor indicates load lock pressure at least as high as ambient pressure;

providing an absolute vacuum pressure output from the controller, the absolute vacuum pressure output being taken from the computed absolute pressure at low vacuum; and in the controller, recalibrating the computed absolute pressure automatically when the computed absolute pressure at high vacuum does not match the negative of measured ambient pressure.

* * * * *